(12) United States Patent
Sun et al.

(10) Patent No.: US 12,519,301 B2
(45) Date of Patent: Jan. 6, 2026

(54) LOAD SWITCH AND POWER SYSTEM

(71) Applicants: Nexperia Technology (Shanghai) Ltd., Shanghai (CN); NEXPERIA B.V., Nijmegen (NL)

(72) Inventors: Menghan Sun, Shanghai (CN); Jianhua Duan, Shanghai (CN)

(73) Assignees: Nexperia Technology (Shanghai) Ltd., Shanghai (CN); Nexperia B.V., Nijmegen (NL)

( * ) Notice: Subject to any disclaimer, the term of this patent is extended or adjusted under 35 U.S.C. 154(b) by 406 days.

(21) Appl. No.: 18/320,601

(22) Filed: May 19, 2023

(65) Prior Publication Data
US 2023/0378950 A1    Nov. 23, 2023

(30) Foreign Application Priority Data
May 20, 2022    (CN) .......................... 202210549017.7

(51) Int. Cl.
| | |
|---|---|
| *H02H 3/00* | (2006.01) |
| *H02H 3/18* | (2006.01) |
| *H02H 3/28* | (2006.01) |
| *H03K 17/082* | (2006.01) |

(52) U.S. Cl.
CPC .............. *H02H 3/003* (2013.01); *H02H 3/18* (2013.01); *H02H 3/28* (2013.01); *H03K 17/0822* (2013.01); *H03K 2217/0009* (2013.01); *H03K 2217/0027* (2013.01)

(58) Field of Classification Search
CPC ......... H03K 17/08–0828; H02H 3/003; H02H 3/18; H02H 3/28
See application file for complete search history.

(56) References Cited

U.S. PATENT DOCUMENTS

| | | | |
|---|---|---|---|
| 11,821,927 B2* | 11/2023 | Mondal | H02M 3/1582 |
| 2013/0063116 A1* | 3/2013 | Sun | H03K 17/302 |
| | | | 327/434 |
| 2014/0257632 A1* | 9/2014 | Kanzaki | B60R 16/033 |
| | | | 701/36 |
| 2018/0102636 A1* | 4/2018 | Wan | H02H 11/003 |
| 2019/0214973 A1* | 7/2019 | Choi | H03K 3/012 |

* cited by examiner

*Primary Examiner* — Thienvu V Tran
*Assistant Examiner* — Christopher J Clark
(74) *Attorney, Agent, or Firm* — Ruggiero McAllister & McMahon LLC

(57) ABSTRACT

A load switch and a power system are provided. The load switch includes a power input terminal, a power output terminal, a voltage-current conversion circuit, a capacitor and a comparator. The power input terminal is configured to receive an input voltage. The power output terminal is configured to provide an output voltage. The voltage-current conversion circuit includes a first input terminal, a second input terminal and a current difference output terminal. The first input terminal and the second input terminal are connected to the power output terminal and the power input terminal, respectively, and configured to receive the output voltage and the input voltage, respectively. A current difference characterizing a voltage difference between the output voltage and the input voltage is output at the current difference output terminal.

18 Claims, 3 Drawing Sheets

LOAD SWITCH AND POWER SYSTEM

CROSS-REFERENCE TO RELATED APPLICATIONS

This application claims the benefit under 35 U.S.C. § 119(a) of Chinese Application No. 202210549017.7 filed May 20, 2022, the contents of which are incorporated by reference herein in their entirety.

BACKGROUND

1. Field of the Disclosure

The current disclosure belongs to the field of electronic devices, and particularly relates to a load switch and a power system.

2. Description of the Related Art

An existing load switch includes various types of reverse current blocking (RCB) functions, and typically utilizes a comparator to continuously monitor a voltage difference between an output voltage ($V_{OUT}$) and an input voltage ($V_{IN}$) to determine whether to trigger the reverse current blocking functions based on the voltage difference. A fixed intentional positive offset is typically applied to both input terminals of the comparator to meet the requirements of an inductive load, thus allowing the output voltage ($V_{OUT}$) to slightly exceed the input voltage ($V_{IN}$) by a small margin. A fixed delay is typically included in the comparator to handle short transient events. To avoid oscillation, hysteresis is implemented at the input terminals of the comparator, which would increase the intentional positive offset. That is, the load switch in the prior art typically triggers the reverse current blocking functions through a fixed voltage and a delay offset.

However, this may be problems to implement these fixed values. In the load switch, a constant reverse voltage means a constant reverse current, which may cause a voltage across a power device to exceed a breakdown limit. If the fixed input offset is set to be too high, the power device may be left unprotected. On the other hand, if the margin is set to be too low, false alarms may be frequently triggered. Similarly, if the fixed delay is set to be too big such that the comparator output remains in a previous state in the load switch for a long period, the immediate triggering of the reverse current blocking functions is delayed, which may cause danger. Further if the fixed delay is set to be too small, false alarms may be triggered.

SUMMARY

The current disclosure intends to solve at least one of the problems in the prior art and provides a load switch and a power system.

The load switch includes: a power input terminal, a power output terminal, a voltage-current conversion circuit, a capacitor and a comparator, wherein, the power input terminal is configured to receive an input voltage; the power output terminal is configured to provide an output voltage; the voltage-current conversion circuit includes a first input terminal, a second input terminal and a current difference output terminal, wherein the first input terminal and the second input terminal are connected to the power output terminal and the power input terminal, respectively, and configured to receive the output voltage and the input voltage, respectively; and a current difference characterizing a voltage difference between the output voltage and the input voltage is output at the current difference output terminal; a first terminal of the capacitor is connected to the current difference output terminal, for integrating the current difference to obtain an average voltage difference characterizing the voltage difference between the output voltage and the input voltage during an integration period for the capacitor, and a second terminal of the capacitor is connected to a ground line; and the first terminal of the capacitor is further connected to a first input terminal of the comparator, a second input terminal of the comparator is applied with at least one reference voltage, and an output terminal of the comparator is a reverse current protection terminal to determine whether to send a signal for preventing current from flowing from the power output terminal to the power input terminal according to a value at the output terminal of the comparator.

In one embodiment, the load switch further includes a reference voltage module, wherein the reference voltage module includes a plurality of hysteresis resistors connected in series between the ground line and a reference voltage terminal and configured to provide the at least one reference voltage.

In one embodiment, the load switch further includes a plurality of hysteresis transistors, wherein first electrodes of the plurality of hysteresis transistors are all connected to the second terminal of the comparator; second electrodes of the plurality of hysteresis transistors are connected between every two adjacent hysteresis resistors in the plurality of hysteresis resistors, respectively; and gate electrodes of the plurality of hysteresis transistors are connected to the output terminal of the comparator, respectively.

In one embodiment, the load switch further includes a plurality of inverters, wherein the plurality of inverters are connected in series, an input terminal of a first inverter of the plurality of inverters is connected to the reverse current protection terminal, and output terminals of the plurality of inverters are connected to the gate electrodes of the hysteresis transistors, respectively.

In one embodiment, the plurality of hysteresis resistors includes a first hysteresis resistor, a second hysteresis resistor, and a third hysteresis resistor connected in series between the reference voltage terminal and the ground line; the plurality of hysteresis transistors includes a first hysteresis transistor and a second hysteresis transistor; the plurality of inverters includes a first inverter and a second inverter; and a gate electrode of the first hysteresis transistor is connected to an output terminal of the first inverter, a gate electrode of the second hysteresis transistor is connected to an output terminal of the second inverter, a second electrode of the first hysteresis transistor is connected between the second hysteresis resistor and the third hysteresis resistor, and a second electrode of the second hysteresis transistor is connected between the third hysteresis resistor and the ground line.

In one embodiment, the voltage-current conversion circuit includes a differential folded cascode amplifier.

In one embodiment, the differential folded cascode amplifier includes a first conversion transistor, a second conversion transistor, a third conversion transistor, a fourth conversion transistor, a first conversion resistor, a first current source, a second current source, a third current source, and a fourth current source, the first input terminal is connected to a gate electrode of the first conversion transistor, the second input terminal is connected to a gate electrode of the second conversion transistor, second electrodes of the first conversion transistor and the second conversion transistor are connected to a first voltage source, a first electrode of the first conversion transistor is connected to a first terminal of the first current source, a second terminal of the first current source is connected to the ground line, a first electrode of the second conversion transistor is connected to a first terminal of the second current source, and a second terminal of the second current source is connected to the ground line; the first electrode of the first conversion transistor is connected to a gate electrode of the third conversion transistor, a first electrode of the third conversion transistor is connected to a first terminal of the third current source, a second terminal of the third current source is connected to the ground line, and a second electrode of the third conversion transistor is connected to the current difference output terminal for transmitting an output current characterizing the output voltage to the current difference output terminal; the first electrode of the second conversion transistor is connected to a gate electrode of the fourth conversion transistor, a first electrode of the fourth conversion transistor is connected to a first terminal of the fourth current source, a second terminal of the fourth current source is connected to the ground line, and a second electrode of the fourth conversion transistor is connected to the current difference output terminal for transmitting an input current characterizing the input voltage to the current difference output terminal; and the first conversion resistor is connected between the first electrode of the third conversion transistor and the first electrode of the fourth conversion transistor.

In one embodiment, the differential folded cascode amplifier further includes a fifth conversion transistor, a sixth conversion transistor, a seventh conversion transistor, and an eighth conversion transistor, gate electrodes of the fifth and sixth conversion transistors are connected together, first electrodes of the fifth and sixth conversion transistors are connected to the first voltage source, gate electrodes of the seventh and eighth conversion transistors are connected together, first electrodes of the seventh and eighth conversion transistors are connected to second electrodes of the fifth and sixth conversion transistors, respectively, second electrodes of the seventh conversion transistor and the eighth conversion transistor are both connected to the current difference output terminal, and the second electrode of the third conversion transistor is connected to the first electrode of the eighth conversion transistor to be connected to the current difference output terminal through the eighth conversion transistor, and the second electrode of the fourth conversion transistor is connected to the first electrode of the seventh conversion transistor to be connected to the current difference output terminal through the seventh conversion transistor.

In one embodiment, the differential folded cascode amplifier further includes a ninth conversion transistor, a tenth conversion transistor, an eleventh conversion transistor, a twelfth conversion transistor, and a fourth conversion resistor, the second electrode of the seventh conversion transistor is connected to gate electrodes of the ninth and tenth conversion transistors and to a first terminal of the fourth conversion resistor to be connected to the current difference output terminal through the ninth and tenth conversion transistors, a second terminal of the fourth conversion resistor is connected to a second electrode of the ninth conversion transistor and to gate electrodes of the eleventh and twelfth conversion transistors, first electrodes of the ninth and tenth conversion transistors are connected to second electrodes of the eleventh and twelfth conversion transistors, respectively, first electrodes of the eleventh and twelfth conversion transistors are both connected to the ground line, and a second electrode of the tenth conversion transistor is connected to the current difference output terminal.

In one embodiment, the differential folded cascode amplifier further includes a fifteenth conversion transistor, a sixteenth conversion transistor, a third resistor, and a fifth current source, a gate electrode of the fifteenth conversion transistor is connected to the gate electrode of the fifth conversion transistor, a first electrode of the fifteenth conversion transistor is connected to the first voltage source; a gate electrode of the sixteenth conversion transistor is connected to the gate electrode of the seventh conversion transistor, and a first electrode of the sixteenth conversion transistor is connected to a second electrode of the fifteenth conversion transistor; the gate electrode of the sixteenth conversion transistor is connected to a first terminal of the fifth current source to turn on the seventh conversion transistor, the eighth conversion transistor and the sixteenth conversion transistor through the fifth current source, a second terminal of the fifth current source is connected to the ground line, and the gate electrode of the fifteenth conversion transistor is connected to a second electrode of the sixteenth conversion transistor and a first terminal of the third resistor, and a second terminal of the third resistor is connected to the gate electrode of the sixteenth conversion transistor and the first terminal of the fifth current source, so as to turn on the fifth conversion transistor, the sixth conversion transistor and the fifteenth conversion transistor through the fifth current source.

In one embodiment, the load switch further includes a reverse current blocking circuit connected to the reverse current protection terminal and configured to determine whether the reverse current blocking circuit is activated according to a value at the reverse current protection terminal.

A power system of the current disclosure includes a power device and the load switch, wherein the power input terminal of the load switch is connected to the power device; and the power output terminal of the load switch is connected to a load to which power is to be supplied.

Unlike the prior art, in the current disclosure, a trigger decision is made based on the average of the voltage difference between the output voltage and the input voltage during the integration period of the capacitor, to activate the reverse current blocking function. For a smaller reverse voltage, i.e., a smaller difference between the output voltage and the input voltage, the power device may withstand such a stress for a longer time. However, for a larger reverse voltage, i.e. a larger stress, the power device may break down very quickly. To address this problem of the prior art, in the current disclosure, the current difference between the output current and the input current, which characterizes the difference between the output voltage and the input voltage, is integrated by a capacitor, so the load switch of the current disclosure may respond quickly to a larger reverse stress, and increases the trigger delay for a smaller reverse stress, which reduces damage to the power device and false positives.

In addition, in the current disclosure, the reference voltage for comparison is provided. Compared with the prior art in which a fixed intentional positive offset is introduced to two input comparison terminals for the input voltage and the output voltage in a previous stage of the load switch, different delay offsets may be set as needed in the current disclosure. Meanwhile, hysteresis may be introduced by providing the reference voltage, so that the oscillation of the comparator could be avoided. That is, the load switch of the current disclosure does not need the intentional voltage offset at the input stage to optimize the minimum detectable reverse voltage and current.

BRIEF DESCRIPTION OF THE DRAWINGS

The accompanying drawings, which are provided for further understanding of embodiments of the current disclosure and constitute a part of this specification, are for explaining the current disclosure together with the embodiments of the current disclosure, but are not intended to limit the current disclosure. The above and other features and advantages will become more apparent to one of ordinary skill in the art by describing detailed exemplary embodiments thereof with reference to the drawings. In the drawings.

DETAILED DESCRIPTION

In order to enable one of ordinary skill in the art to better understand the technical solutions of the current disclosure, the current disclosure will be described in further detail with reference to the accompanying drawings and the detailed description.

Figure 1:
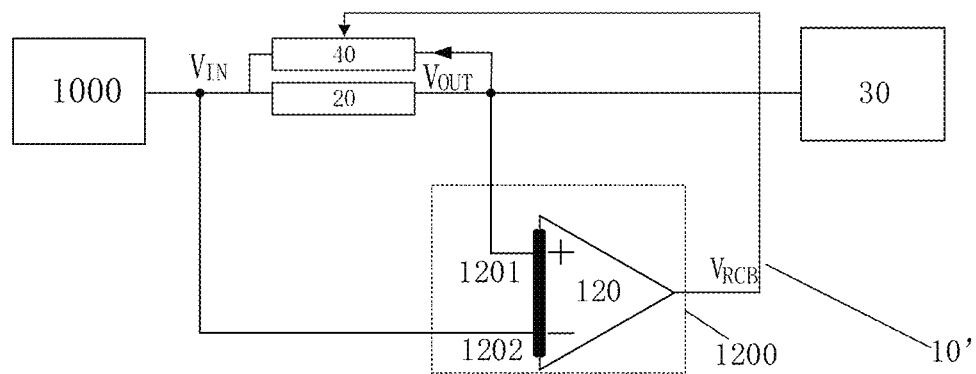
FIG. 1 shows a schematic diagram of a power system including a reverse current blocking function in the prior art.

As shown in FIG. 1, in the prior art, a power device including a load switch 10' generally connects a power supply 1000 to a load 30. The power device includes a turn-on switch module 20 configured to electrically connect/disconnect the power supply 1000 to/from the load 30 or to provide an output current limit based on a switching signal. Generally, the load switch 10' also provides a reverse current blocking circuit 40 configured to prevent a reverse current from flowing from the load 30 back to the power supply 1000 to provide a reverse current blocking function.

As shown in FIG. 1, a comparator 120 is commonly used in the prior art to compare an input voltage $V_{IN}$ and an output voltage $V_{OUT}$ at two terminals of the load switch, so as to determine whether to activate the reverse current blocking function in the load switch according to a signal $V_{RCB}$ (e.g., a high level signal or a low level signal) at an output terminal of the comparator 120.

In the prior art, the comparator 120 monitors the output voltage $V_{OUT}$ and the input voltage $V_{IN}$ in real time, and inputs the two voltages to a non-inverting input terminal and an inverting input terminal of the comparator 120, respectively, for comparison. When a difference between the two voltages at the two input terminals of the comparator 120 reaches a fixed input offset, that is, the output voltage $V_{OUT}$ is greater than the input voltage $V_{IN}$ by a certain degree, such as a first threshold, the comparator 120 then activates the reverse current blocking circuit 40 that prevents current from flowing from the output voltage $V_{OUT}$ side to the input voltage $V_{IN}$ side. When the output voltage $V_{OUT}$ is greater than the input voltage $V_{IN}$ by a certain value smaller than the first threshold, the comparator 120 will not activate the reverse current blocking circuit 40, which may result that the reverse current may break down the power device. For example, if the fixed input offset between the input voltage $V_{IN}$ and the output voltage $V_{OUT}$ is set to 60 mV, the reverse current will reach 1A when a reverse on-resistance $R_{ON}$ is 60 mΩ, which is likely to break down the power device.

Aiming at solving the problems in the prior art that it is necessary to monitor the difference between the input voltage and the output voltage in real time the power device is not protected due to a too large fixed input offset, while false alarms frequently occur due to a too small fixed input offset, and the like, the current disclosure provides a load switch.

Figure 2:
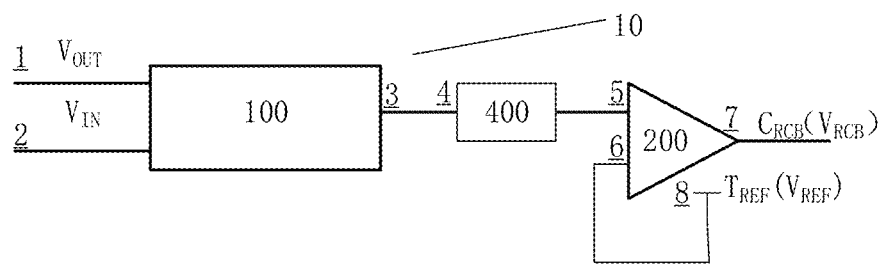
FIG. 2 shows a schematic diagram of a load switch according to an embodiment of the current disclosure.

Compared with the prior art, the load switch provided by the current disclosure does not monitor the difference between the input voltage and the output voltage in real time, but monitors an average value of the difference between the output voltage and the input voltage within a time period, and determines whether to activate the reverse current blocking function according to the average value. Specifically, as shown in FIG. 2, a load switch 10 of the current disclosure includes a power input terminal 1, a power output terminal 2, a voltage-current conversion circuit 100, an integrator 400, and a comparator 200. As shown in FIG. 2, the power input terminal 1 is connected to a power supply (1000 shown in FIG. 1) and receives an input voltage $V_{IN}$ provided by the power supply. The power output terminal 2 is connected to a load (e.g., the load 30 shown in FIG. 1 or FIG. 4) to provide an output voltage $V_{OUT}$ to the load. The voltage-current conversion circuit 100 includes a first input terminal, a second input terminal and a current difference output terminal 3, wherein the first input terminal and the second input terminal are connected to the power output terminal 2 and the power input terminal 1, respectively, for respectively receiving the output voltage $V_{OUT}$ and the input voltage $V_{IN}$, and outputting a current difference $I_D$ corresponding to the voltage difference between the output voltage $V_{OUT}$ and the input voltage $V_{IN}$ at the current difference output terminal 3. The voltage-current conversion circuit 100 may include other input terminals, such as a power supply terminal and a ground terminal, in addition to the first input terminal 1 and the second input terminal 2. The first terminal 4 of the integrator 400 is connected to the current difference output terminal 3 to integrate the current difference $I_D$, so as to obtain an average voltage difference between the output voltage $V_{OUT}$ and the input voltage $V_{IN}$ during a time period, i.e., an average voltage difference Vcap integrated by the integrator during the time period. The integrator 400 is further connected to a first input terminal 5 of the comparator 200. A reference voltage Vref is input to a second input terminal of the comparator 200, and a value of an output terminal of the comparator 200 may be used to determine whether to issue a signal for preventing current from flowing from the power output terminal to the current input terminal.

In the load switch of the current disclosure shown in FIG. 2, the voltage-current conversion circuit 100 converts the output voltage and the input voltage into the output current and the input current, respectively, and integrate the difference therebetween to obtain the average voltage difference Vcap between the output voltage and the input voltage. The comparator 200 outputs a specific value according to the average voltage difference Vcap to determine whether to trigger the reverse current blocking function of the load switch.

Figure 7:
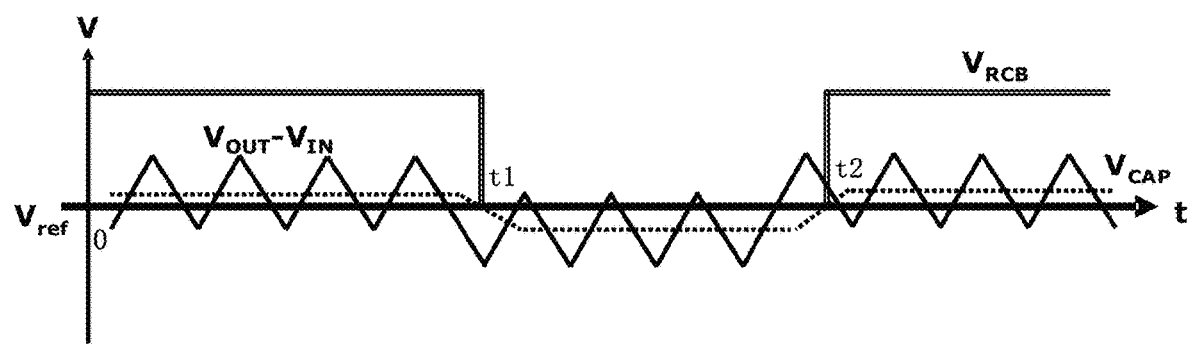
FIG. 7 shows a schematic diagram of a waveform for an operation of a load switch according to an embodiment of the current disclosure.

As shown in FIG. 7, the average value Vcap of the voltage difference, obtained by integrating the current difference which characterizes the difference between the output voltage $V_{OUT}$ and the input voltage $V_{IN}$ during a time period (0, t1), is greater than the reference voltage Vref, and a high level signal is output from the output terminal of the comparator 200 during the time period, and at this time, the reverse current blocking function may be activated to prevent the current from flowing from the power output terminal to the power input terminal, and the current from flowing from the power input terminal to the power output terminal may be stopped. The average value Vcap of the voltage difference obtained by integrating the current difference during a time period (t1, t2) is greater than the reference voltage Vref, and a low level signal is output from the output terminal of the comparator 200 during the time period, and at this time, it is unnecessary to activate the reverse current blocking function. During a short time period before and after time t2, the value obtained by integrating the current difference by the integrator 400 is greater than the reference voltage Vref, and at this time, a high level signal is output from the output terminal of the comparator 200, thereby activating the reverse current blocking function again.

In an embodiment of the current disclosure, the integrator 400 may keep integrating the current difference until the reverse current blocking function is triggered to prevent the reverse current from flowing from the power output terminal to the power input terminal. At this time, the load switch may be turned off, so that the output voltage $V_{OUT}$ may be significantly reduced to place the integrator 400 in a discharge state. Once the load switch operates normally, the integrator 400 would resume to integrate the current difference. In this way, any voltage difference between the output voltage and the input voltage during the normal operation of the load switch may be taken into consideration when the load switch is determining whether to trigger the reverse current blocking function in the integration operation, which avoids the determination of whether to activate the reverse current blocking function or not only according to the obtained real-time voltage difference as in the prior art, so that the probability of breaking down the power device is apparently reduced in the current disclosure. In this embodiment, the reference voltage $V_{REF}$ is input to the second input terminal 6 of the comparator 200, and an output terminal 7 of the comparator 200 is a reverse current protection terminal $C_{RCB}$. The load switch 10 of the current disclosure may determine whether to activate the reverse current blocking circuit 40 in the load switch 20 to prevent the current from flowing from the power output terminal 1 to the power input terminal 2 according to a value at the reverse current protection terminal $C_{RCB}$ of the comparator 200. For example, when the value $V_{RCB}$ at the reverse current protection terminal $C_{RCB}$ is at a high level, it would activate the reverse current blocking circuit 40 in the load switch 20 to prevent the current from flowing from the output voltage terminal to the input voltage terminal. When the value $V_{RCB}$ at the reverse current protection terminal $C_{RCB}$ is at a low level, it does not activate the reverse current blocking circuit 40 in the load switch 20 to operate.

Figure 4:
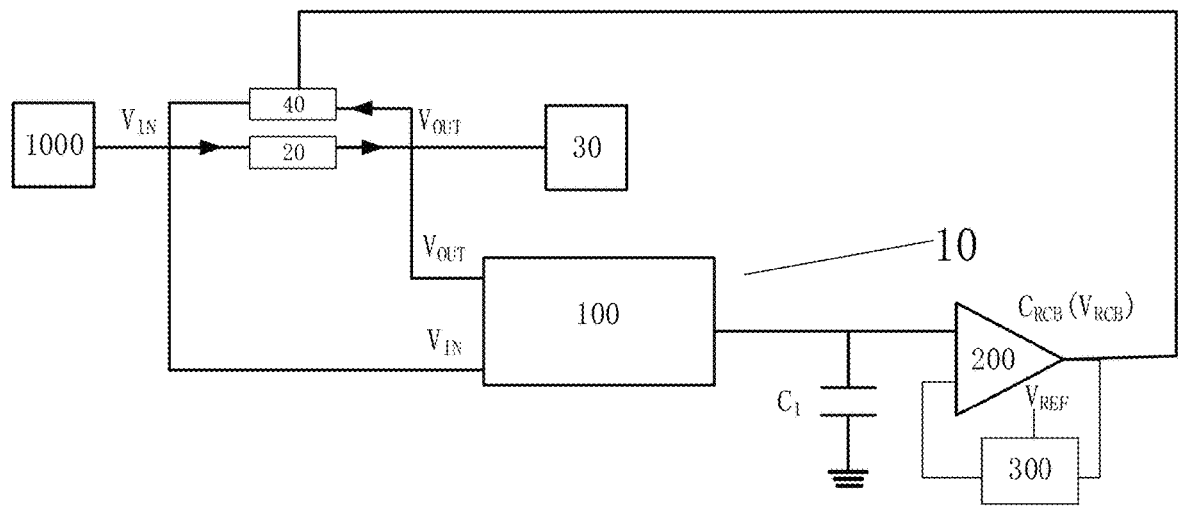
FIG. 4 shows a schematic diagram of a power system according to an embodiment of the current disclosure.

As shown in FIG. 4, the integrator 400 of the current disclosure includes a capacitor C1. In this embodiment, a first terminal of the capacitor C1 is connected to the current difference output terminal of the voltage-current conversion circuit 100, and a second terminal of the capacitor C1 may be grounded.

The input voltage $V_{IN}$ and the output voltage $V_{OUT}$ at two terminals of the load switch are input to the voltage-current conversion circuit 100 of the current disclosure, converts the input voltage $V_{IN}$ and the output voltage $V_{OUT}$ into the input current $I_{IN}$ and the output current $I_{OUT}$, respectively, outputs the current difference ID ($I_{OUT}$-$I_{IN}$) at the output terminal 3 of the voltage-current conversion circuit 100. The capacitor C1 integrates the current difference ID ($I_{OUT}$-$I_{IN}$), thereby obtaining the average value of the difference between the output voltage $V_{OUT}$ and the input voltage $V_{IN}$ during the integration period, as shown in FIG. 5.

Figure 5:
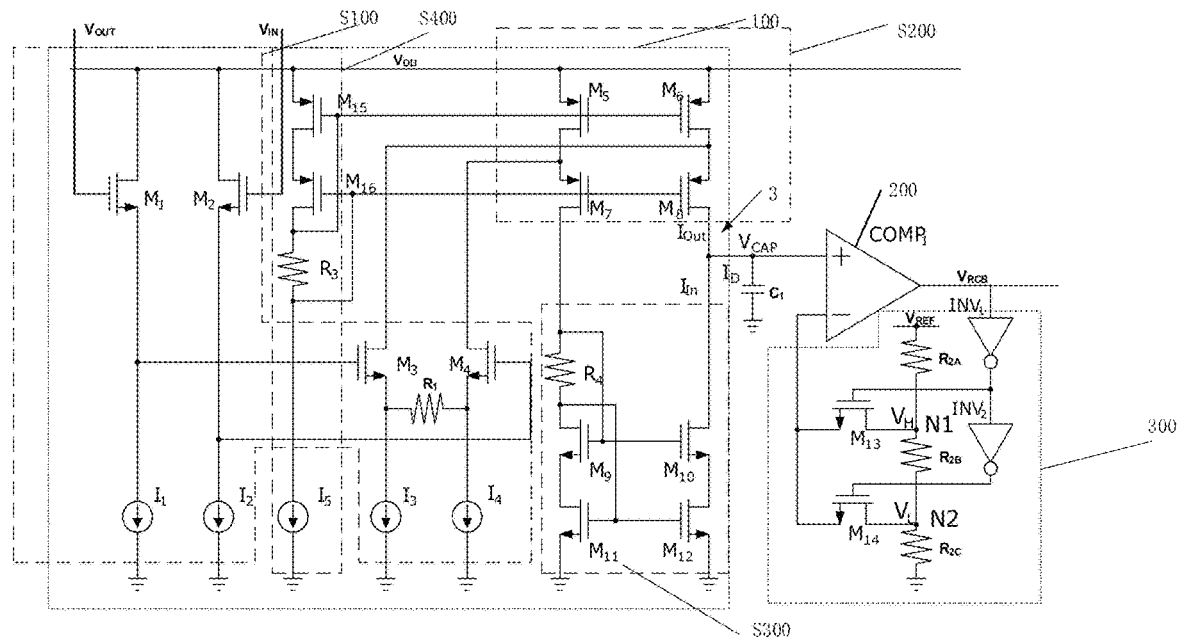
FIG. 5 shows a circuit diagram of a load switch according to an embodiment of the current disclosure.

As may be seen from the above, compared with the load switch in the prior art that the difference between the output voltage $V_{OUT}$ and the input voltage $V_{IN}$ is monitored in real time and whether to activate the reverse current blocking circuit is determined based on the voltage difference obtained by the real time monitoring, the load switch of the current disclosure monitors the average value of the difference between the output voltage $V_{OUT}$ and the input voltage $V_{IN}$ during the integration period, as shown in FIG. 5 and described below. The current disclosure determines whether to trigger the reverse current blocking function by using the average value, rather than simply detecting that the output voltage $V_{OUT}$ is greater than the input voltage $V_{IN}$ by a certain degree, such as the first threshold using the comparator, to trigger the reverse current blocking function in the load switch.

The load switch 10 of the current disclosure includes the reverse current blocking circuit 40 in addition to the structure for determining whether to activate the reverse current blocking circuit 40 shown in FIG. 2. Specifically, in the load switch 10 of the current disclosure, the power input terminal 1 and the power output terminal 2 are respectively connected to two terminals of the reverse current blocking circuit 40, and the power output terminal 1 is also connected to the load 30 to which power is to be supplied. In the embodiment shown in FIG. 4, the load switch 10 of the current disclosure further includes the turn-on switch module 20 connected between the power input terminal 1 and the power output terminal 2 and configured to control the current to flow from the power input terminal to the power output terminal. The turn-on switch module 20 may further include other functional modules included in the load switch, such as a current limiting module, which would be known to a person skilled in the art. The reverse current protection terminal $C_{RCB}$ (i.e., the output terminal of the comparator 200) of the load switch 10 of the current disclosure is connected to the reverse current blocking circuit 40 and configured to determine whether to activate the reverse current blocking circuit 40 for preventing the current from flowing from the power output terminal to the power input terminal according to the signal at the reverse current protection terminal $C_{RCB}$. For example, when the signal at the reverse current protection terminal $C_{RCB}$ is at a high level, the reverse current blocking circuit 40 is activated to prevent a current from flowing from the power output terminal to the power input terminal.

Based on the load switch 10 of the current disclosure, the current disclosure also provides a power system, which includes a power device 1000 and the load switch 10 of the current disclosure, wherein the power input terminal 1 of the load switch 10 is connected to the power device 1000. The power output terminal 2 of the load switch 10 is connected to the load 30 to which power is to be supplied, as shown in FIG. 4.

The load switch 10 of the embodiment of the current disclosure shown in FIG. 5 includes the voltage-current conversion circuit 100, which may be a differential folded cascode amplifier and may include a power input terminal 1 (to which the input voltage $V_{IN}$ is input), a power output terminal 2 (to which the output voltage $V_{OUT}$ is input), a first power terminal $T_{DD}$ (to which a first power supply $V_{DD}$ is input), and a second power terminal $T_{ss}$ (to which a second power supply Vss is input, e.g., the second power terminal $T_{ss}$ is grounded). The voltage-current conversion circuit 100 further includes a first conversion transistor M1, a second conversion transistor M2, a third conversion transistor M3, a fourth conversion transistor M4, a fifth conversion transistor M5, a sixth conversion transistor M6, a seventh conversion transistor M7, an eighth conversion transistor M8, a ninth conversion transistor M9, a tenth conversion transistor M10, an eleventh conversion transistor M11, a twelfth conversion transistor M12, a fifteenth conversion transistor M15, and a sixteenth conversion transistor M16. The voltage-current conversion circuit 100 further includes a first conversion resistor R1, a third conversion resistor R3, and a fourth conversion resistor R4. The voltage-current conversion circuit 100 further includes a first current source I1, a second current source I2, a third current source I3, a fourth current source I4 and a fifth current source I5.

In the above voltage-current conversion circuit 100, second electrodes (e.g., which are drain electrodes when the first and second conversion transistors M1 and M2 are NMOS) of the first and second conversion transistors M1 and M2 are both connected to the first power terminal Too, gate electrodes of the first and second conversion transistors M1 and M2 are connected to the power output terminal 2 and the power input terminal 1, respectively, and first electrodes (e.g., which are sources electrodes when the first and second conversion transistors M1 and M2 are NMOS) of the first and second conversion transistors M1 and M2 are connected to one terminal of the first current source I1 and one terminal of the second current source I2, respectively. The other terminal of the first current source I1 and the other terminal of the second current source I2 are both grounded. First electrodes of the third and fourth conversion transistors M3 and M4 are connected to one terminal of the third current source I3 and one terminal of the fourth current source I4, respectively. The other terminal of the third current source I3 and the other terminal of the fourth current source I4 are both grounded. In the current disclosure, the first current source I1 to the fourth current source I4 are used in the voltage-current conversion circuit 100 to provide bias currents, so that the input voltage $V_{IN}$ and the output voltage $V_{OUT}$ respectively at the power input terminal 1 and the power output terminal 2 may be converted into currents, and then flow to the capacitor C1 for integration. Gate electrodes of the third and fourth conversion transistors M3 and M4 are connected to the first electrodes of the first and second conversion transistors M1 and M2, respectively, and a first resistor R1 is connected between first electrodes of the third and fourth conversion transistors M3 and M4.

Gate electrodes of the fifth, sixth and fifteenth conversion transistors M5, M6, M15 are connected together. First electrodes of the fifth, sixth and fifteenth conversion transistors M5, M6, M15 are connected to the first power terminal Too. A second electrode of the fifth conversion transistor M5 is connected to a second electrode of the fourth conversion transistor M4, and a second electrode of the sixth conversion transistor M6 is connected to a second electrode of the third conversion transistor M3. Gate electrodes of the seventh, eighth, and sixteenth conversion transistors M7, M8, and M16 are connected together, and first electrodes of the seventh, eighth and sixteenth conversion transistors M7, M8, and M16 are connected to second electrodes of the fifth, sixth, and fifteenth conversion transistors M5, M6, and M15, respectively. A second electrode of the sixteenth conversion transistor M16 is connected to a first terminal of a third resistor R3; a second terminal of the third resistor R3 is connected to one terminal of the fifth current source I5; and the other terminal of the fifth current source I5 is grounded. In addition, the gate electrode of the fifteenth conversion transistor M15 is connected to the first terminal of the third resistor R3.

Gate electrodes of the ninth and tenth conversion transistors M9 and M10 are connected together and to a second electrode of the seventh conversion transistor M7, which is in turn connected to a first terminal of a fourth resistor R4. A second terminal of the second resistor R4 is connected to a second electrode of the ninth conversion transistor M9, and a second electrode of the tenth conversion transistor M10 is connected to a second electrode of the eighth conversion transistor M8. Gate electrodes of the eleventh and twelfth conversion transistors M11 and M12 are connected together. First electrodes of the eleventh and twelfth conversion transistors M11 and M12 are both grounded. A second electrode of the eleventh conversion transistor M11 is connected to a first electrode of the ninth conversion transistor M9. A second electrode of the twelfth conversion transistor M12 is connected to a first electrode of the tenth conversion transistor M10, and a gate electrode of the eleventh conversion transistor M11 is connected to a second terminal of the fourth resistor R4. Second electrodes of the eighth conversion transistor M8 and the tenth conversion transistor M10 are connected together as the current difference output terminal of the voltage-current conversion circuit 100, which is connected to the first terminal 4 of the capacitor C1 (to which the integration voltage Vcap is input).

Figure 3:
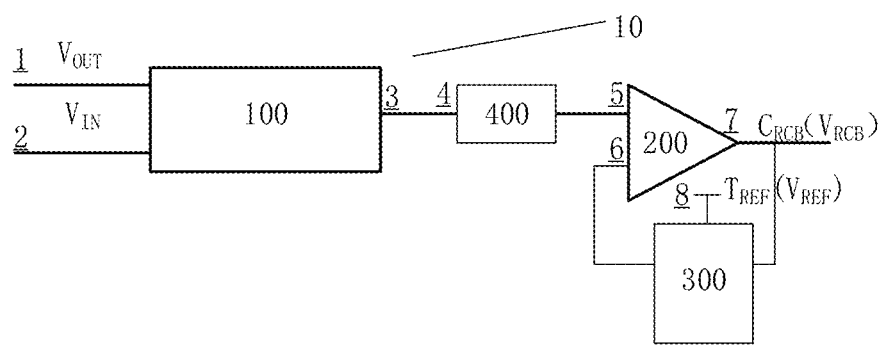
FIG. 3 shows a schematic diagram of a load switch according to an embodiment of the current disclosure.

As shown in FIG. 3, the load switch 10 of the current disclosure may further include a reference voltage module 300 connected between the second input terminal 6 and the output terminal 7 (i.e., the reverse current protection terminal $C_{RCB}$) of the comparator 200, and may further include a reference voltage terminal 8 connected to the reference voltage $V_{REF}$. The combination of the reference voltage module 300 and the comparator 200 of the current disclosure may implement a comparator with hysteresis, which functions similar to a Schmitt trigger.

As shown in FIG. 5, the comparator 200 of the load switch 10 according to the embodiment of the current disclosure is a comparator $COMP_1$, a non-inverting input terminal of which is connected to the first terminal Vcap of the capacitor C1, and an inverting input terminal of which is connected to the reference voltage module 300. The reference voltage module 300 shown in FIG. 5 includes a first inverter $INV_1$, a second inverter $INV_2$, a first hysteresis resistor $R_{2A}$, a second hysteresis resistor $R_{2B}$, a third hysteresis resistor $R_{2C}$, a first hysteresis transistor M13, and a second hysteresis transistor M14. An input terminal of the first inverter INV1 is connected to the output terminal $V_{RCB}$ of the comparator COMP1. An output terminal of the first inverter INV1 is connected to an input terminal of the second inverter $INV_2$ and a gate electrode of the first hysteresis transistor M13, and an output terminal of the second inverter INV2 is connected to a gate electrode of the second hysteresis transistor M14. That is, whether to turn on the first hysteresis transistor M13 is controlled by an output level of the first inverter INV1, and whether to turn on the second hysteresis transistor M14 is controlled by an output level of the second inverter INV2. The first, second, and third hysteresis resistors R2A, R2B, and R2C are connected in series between the reference voltage terminal $V_{REF}$ and the ground line. A first connection node N1 between the first and second hysteresis resistors R2A and R2B is connected to a second electrode of the first hysteresis transistor M13, and a second connection node N2 between the second and third hysteresis resistors R2B and R2C is connected to a second electrode of the second hysteresis transistor M14. First electrodes of the first hysteresis transistor M13 and the second hysteresis transistor M14 are both connected to the inverting input terminal of the comparator COMP1. However, the current disclosure is not limited thereto. For example, a plurality of resistors may be connected in series or in parallel in different manners to provide voltage dividing nodes to provide different reference voltages.

In the voltage-current conversion circuit 100 shown in FIG. 5, the output voltage $V_{OUT}$ and the input voltage $V_{IN}$ are input to the gate electrode of the first conversion transistor M1 and the gate electrode of the second conversion transistor M2, respectively. The first conversion transistor M1 and the second conversion transistor M2 drop the output voltage $V_{OUT}$ and the input voltage $V_{IN}$ to reduce magnitudes of the output voltage $V_{OUT}$ and the input voltage $V_{IN}$, and then applies voltages characterizing the output voltage $V_{OUT}$ and the input voltage $V_{IN}$ to the gate electrode of the third conversion transistor M3 and the gate electrode of the fourth conversion transistor M4, respectively, which are converted into currents characterizing the output voltage $V_{OUT}$ and the input voltage $V_{IN}$ by the third conversion transistor M3 and the fourth conversion transistor M4, respectively.

Current i5 of the fifth current source I5 passes through the third conversion resistor R3 and then is mirrored by the fifteenth conversion transistor M15 as a current mirror to the fifth conversion transistor M5 as a current source and the sixth conversion transistor M6 as a current source, so as to turn on the fifth conversion transistor M5, the sixth conversion transistor M6 and the fifteenth conversion transistor M15. The seventh conversion transistor M7, the eighth conversion transistor M8 and the sixteenth conversion transistor M16 are common-gate devices, and are turned on by the current i5 of the fifth current source I5 at the same time. Therefore, in FIG. 5, a first current mirror stage 400 of the voltage-current conversion circuit 100 of the current disclosure is formed by the third conversion resistor R3, the fifteenth conversion transistor M15, the sixteenth conversion transistor M16 and the fifth current source I5, and functions of the first current mirror stage 400 are to mirror the current i5 of the fifth current source I5 to the fifth conversion transistor M5, the sixth conversion transistor M6, the seventh conversion transistor M7 and the eighth conversion transistor M8 as a common-gate amplification stage S200 and turn on the fifth conversion transistor M5, the sixth conversion transistor M6, the seventh conversion transistor M7 and the eighth conversion transistor M8 as the common-gate amplification stage S200. Based on this, the current flowing through the fifth conversion transistor M5 is equal to the sum of the current flowing through the fourth conversion transistor M4 and the current flowing through the seventh conversion transistor M7, and the current flowing through the sixth conversion transistor M6 is equal to the current flowing through the third conversion transistor M3 and the current flowing through the eighth conversion transistor M8, wherein the current flowing through the third conversion transistor M3 characterizes the output voltage $V_{OUT}$ and the current flowing through the fourth conversion transistor M4 characterizes the input voltage $V_{IN}$. That is, the currents characterizing the output voltage $V_{OUT}$ and the input voltage $V_{IN}$ are transferred to the eighth and seventh conversion transistors M8 and M7 through the third and fourth conversion transistors M3 and M4, respectively, which are signal input stages. The seventh conversion transistor M7 transfers the input current $I_{IN}$ characterizing the input voltage $V_{IN}$ to the first terminal of the capacitor C1 as the integrator, through the fourth conversion resistor R4, the ninth, tenth, eleventh, and twelfth conversion transistors M9, M10, M11, and M12, as a first current mirror stage S300. The input current $I_{IN}$ and the output current $I_{OUT}$ characterizing the output voltage $V_{OUT}$ from the eighth conversion transistor M8 forms a current difference $I_D = I_{OUT} - I_{IN}$, which is integrated by the capacitor C1 at the first terminal of the capacitor C1, thereby obtaining the average value Vcap of the difference between the output voltage $V_{OUT}$ and the input voltage $V_{IN}$ during the integration period of the capacitor.

Figure 6:
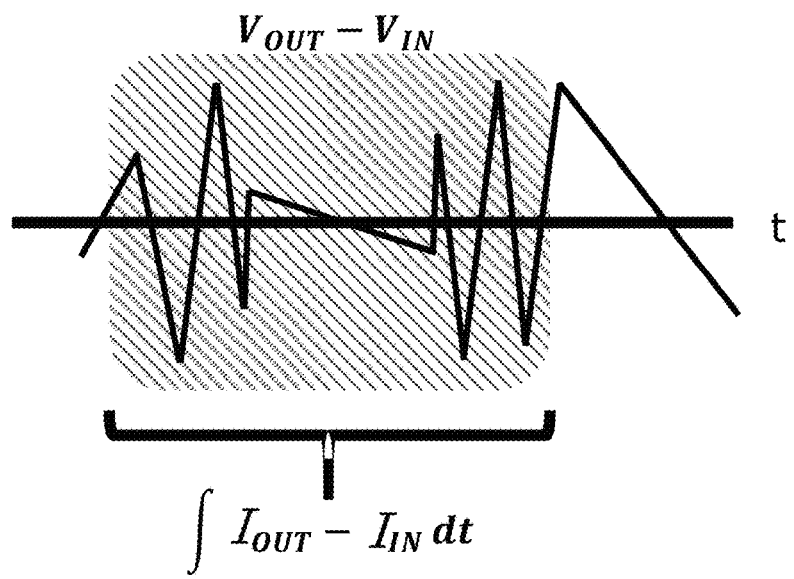
FIG. 6 shows a schematic diagram of a load switch according to an embodiment of the current disclosure.

For example, as shown in FIG. 6, during the integration period, the capacitor C1 integrates the current difference during the integration period:

$$Q = \int I_{OUT} - I_{IN} dt$$

$$U = \frac{\int I_{OUT} - I_{IN} dt}{C}$$

Thus, the integral value characterizing the difference between the output current $I_{OUT}$ and the input current $I_{IN}$ during the time period may be considered as the average of the difference between the output voltage $V_{OUT}$ and the input voltage $V_{IN}$ during the time period.

When the output voltage $V_{OUT}$ is greater than the input voltage $V_{IN}$, the capacitor C1 is charged. When the output voltage $V_{OUT}$ is less than the input voltage $V_{IN}$, the capacitor C1 is discharged.

In the embodiment shown in FIG. 5, the first conversion transistor M1, the second conversion transistor M2, the third conversion transistor M3, the fourth conversion transistor M4, the fifth conversion transistor M5, the sixth conversion transistor M6, the seventh conversion transistor M7, the eighth conversion transistor M8, the ninth conversion transistor M9, the tenth conversion transistor M10, the eleventh conversion transistor M11, the twelfth conversion transistor M12, the first hysteresis transistor M13, the second hysteresis transistor M14, the fifteenth conversion transistor M15 and the sixteenth conversion transistor M16 may be transistors of the same type, such as NMOS transistors, which may be the same size in order to accurately transfer the current difference characterizing the average value of the difference between the output voltage $V_{OUT}$ and the input voltage $V_{IN}$ to the first terminal of the capacitor C1.

Further, resistance values of the third resistor R3 and the fourth resistor R4 may be determined according to currents in respective branches. The third conversion transistor M3 and the fourth conversion transistor M4, which are input stages of the voltage-current conversion circuit 100, may be regarded as a common-source amplification stage S100 in the whole circuit, and source electrodes of the third conversion transistor M3 and the fourth conversion transistor M4 are respectively connected to the third current source I3 and the fourth current source I4, which are both bias current sources. The third and fourth conversion transistors M3 and M4 of the common-source amplification stage S100 convert the voltage signals characterizing the input voltage $V_{IN}$ and the output voltage $V_{OUT}$ from the first and second conversion transistors M1 and M2 into current signals, which are input to the subsequent common-gate amplification stage S200 in the voltage-current conversion circuit 100. The first resistor R1 is connected between the first electrodes of the third conversion transistor M3 and the fourth conversion transistor M4. The resistance of the first resistor R1 could not be set to be too great, and the first resistor with a too large resistance is equivalent to no resistor provided between the first electrodes of the third conversion transistor M3 and the fourth conversion transistor M4, so that a linear range of the voltage-current conversion circuit 100 could not be adjusted.

The voltage-current conversion circuit 100 shown in FIG. 5 is a cascode amplifier as a whole. For example, it may be a differential folded cascode amplifier, that is, a transconductor, and its transconductance Gm depends on a ratio of a total output current I to a total input voltage V of the whole transconductor. In the transconductor shown in FIG. 5, the total input voltage V is the difference between the output voltage $V_{OUT}$ and the input voltage $V_{IN}$. When a difference between the total output current I to the total input voltage V is 0, the transconductance Gm has a curve with a sharp peak, which is not desirable in the current disclosure, because the current disclosure focuses on the range in which the output voltage $V_{OUT}$ is generally closer to the input voltage $V_{IN}$. To solve this problem, the voltage-current conversion circuit 100 according to the embodiment of the current disclosure includes the first resistor R1 connected between the first electrodes of the third conversion transistor M3 and of the fourth conversion transistor M4 to eliminate the above peak, and to provide a curve with a gentle peak at and around the difference of a value of 0 between the output voltage $V_{OUT}$ and the input voltage $V_{IN}$, which is desirable in the current disclosure, because the difference between the output voltage $V_{OUT}$ and the input voltage $V_{IN}$ in the current disclosure is mostly concentrated around a value of 0. Thus, the first resistor R1 is provided for adjusting the linear range to realize the curve with the gentle peak, thereby expanding the linear range. That is, by providing the first resistor R1 between the first electrodes of the third and fourth conversion transistors in the voltage-current conversion circuit 100 for performing the current conversion on the input voltage and the output voltage, the peak curve of the entire transconductance circuit may have a gentle peak around the difference of a value of 0 between the output voltage $V_{OUT}$ and the input voltage $V_{IN}$, thereby facilitating the implementation of the current disclosure.

A magnitude of the first resistor R1 would depend on magnitudes of various parameters in the entire voltage-current conversion circuit 100 and a power system adopting the load switch, for example, depend on the configuration of the first current source I1 to the fourth current source I4.

One embodiment of the voltage-current conversion circuit of the load switch according to the current disclosure is shown as above only as an example. As described above, the voltage-current conversion circuit of the current disclosure is a differential folded cascode amplification circuit that converts two input voltages into currents on two branches and then derives a difference between the currents on the two branches. The difference is output to the integrator at the back end, to obtain the average voltage difference of the difference between the two voltages in a short time period. FIG. 5 is a diagram showing the voltage-current conversion circuit only as an example. However, the current disclosure is not limited thereto.

The reference voltage module 300 as a decision circuit is arranged between the output terminal and the inverting input terminal of the comparator COMP1 in the embodiment shown in FIG. 5.

Specifically, as shown in FIG. 5, in the current disclosure, different reference voltages may be set as needed, so that different intentional positive offset thresholds may be set. For example, the first reference voltage $V_L$ and the second reference voltage $V_H$ in the decision circuit 300 of the current disclosure may be set to select the reference voltage input to the inverting input terminal of the comparator COMP1.

At start, the integration capacitance value Vcap of the capacitor C1 is relatively small, the output terminal of the comparator COMP1 is at a low level, the control terminal $C_{RCB}$ of the decision circuit 300 is at a low level, the output terminal of the first inverter INV1 is at a high level. At this time the first hysteresis transistor M13 is turned on, so that the second reference voltage VH (which is higher than the first reference voltage VL) is input to the inverting input terminal of the comparator COMP1. If a voltage (the average value Vcap of the difference between the output voltage $V_{OUT}$ and the input voltage $V_{IN}$) at the non-inverting input terminal of the comparator COMP1 is higher than the second reference voltage VH, a level at the output terminal of the comparator COMP1 would become high, indicating that the difference between the output voltage $V_{OUT}$ and the input voltage $V_{IN}$ is greater than a certain threshold, so that the reverse blocking circuit is activated to prevent current from flowing from the output voltage terminal to the input voltage terminal.

When a level at the output terminal of the decision circuit 300 becomes high, a level at the output terminal of the first inverter INV1 becomes low, the first hysteresis transistor M13 is turned off, and a level at the output terminal of the second inverter $INV_2$ becomes high. At this time, the second hysteresis transistor M14 is turned on, so that the first reference voltage $V_L$ between the second hysteresis resistor $R_{2B}$ and the third hysteresis resistor $R_{2C}$ is applied to the inverting input terminal of the comparator COMP1 through the turned-on second hysteresis transistor M14. At this time, the voltage at the non-inverting input terminal of the comparator COMP1, which characterizes the average voltage difference Vcap of the difference between the output voltage $V_{OUT}$ and the input voltage $V_{IN}$ during a time period, is compared with the first reference voltage $V_L$. In the case that the reverse current blocking function has been activated, the load switch is turned off. At this time, the capacitor COMP1 would be discharged, so that the average voltage difference Vcap decreases, but during the period when the average voltage difference Vcap is lower than the second reference voltage VH but higher than the first reference voltage $V_L$, the level at the output terminal of the comparator COMP1 is still at a high level.

The above process continues until the capacitor COMP1 is discharged to the extent where the average voltage difference Vcap is lower than the first reference voltage $V_L$. At this time, a level at the output terminal $V_{RCB}$ of the comparator COMP1 would become low, the triggering of the reverse current blocking function of the reverse current blocking circuit is stopped, i.e. not preventing current from flowing from the output voltage terminal to the input voltage terminal, and the load switch would be activated again, and the capacitor COMP1 would restart to integrate the current difference characterizing the voltage difference between the output voltage $V_{OUT}$ and the input voltage $V_{IN}$. When the output terminal $V_{RCB}$ of the comparator COMP1 is at a low level, the output terminal of the first inverter INV1 is at a high level, the first hysteresis transistor M13 is turned on, so that the second reference voltage $V_H$ is input to the inverting input terminal of the comparator COMP1. At this time, even if the capacitor COMP1 has re-activated the integration of the current difference, the average voltage difference Vcap is still less than the second reference voltage $V_H$, the output terminal $V_{RCB}$ of the comparator COMP1 is still at a low level, and activating the reverse current blocking function of the reverse current blocking circuit for preventing the current from flowing from the output voltage terminal to the input voltage terminal is continuously stopped. When the average voltage difference Vcap is higher than the second reference voltage $V_H$, the reverse current blocking function is activated again.

In the embodiment of the current disclosure shown in FIG. 5, a value at the non-inverting input terminal of the comparator COMP1 is the average voltage difference Vcap characterizing the difference between the output voltage $V_{OUT}$ and the input voltage $V_{IN}$. When the difference between the output voltage $V_{OUT}$ and the input voltage $V_{IN}$ is large, the value would reach the reference voltage at the inverting input terminal of the comparator COMP1 quickly, resulting in a fast trigging. When the difference between the output voltage $V_{OUT}$ and the input voltage $V_{IN}$ is small, the value would reach the reference voltage at the inverting input of the comparator COMP1 slowly, resulting in a slow trigging. However, the difference between the output voltage $V_{OUT}$ and the input voltage $V_{IN}$ would be taken into consideration in the entire process. That is, in the current disclosure, the capacitor is used to obtain a shift average value between the output voltage $V_{OUT}$ and the input voltage $V_{IN}$, and the integration of the capacitor enables the load switch to respond to a large reverse stress more quickly while increasing a trigger delay of a small reverse stress, which is almost not harmful to the power device.

In the above process, at the start, the average voltage difference Vcap is relatively small, so that the output terminal of the comparator COMP1 is at a low level, and at this time the voltage at the inverting input terminal of the comparator COMP1 is the larger second reference voltage $V_H$. If the average voltage difference Vcap becomes higher than the second reference voltage $V_H$, the reverse current blocking function is triggered, the voltage at the inverting input terminal of the comparator COMP1 would become lower than the first reference voltage $V_L$ due to the presence of the first inverter INV1, that is, a trigger point would become lower. When the average voltage difference Vcap becomes smaller than the second reference voltage $V_H$ and larger than the first reference voltage $V_L$, the output terminal of the comparator COMP1 is still at a high level. When the reference voltage at the inverting input terminal is the first reference voltage $V_L$, the average voltage difference Vcap decreases to be less than the first reference voltage $V_L$, a level at the output terminal of the comparator COMP1 becomes low, the triggering of the reverse current blocking function is stopped, and the output terminal of the first inverter INV1 is at a high level, the reference voltage at the inverting input terminal of the comparator COMP1 is the second reference voltage $V_H$, and when the average voltage difference Vcap increases to be greater than the first reference voltage $V_L$ and less than the second reference voltage $V_H$, the output terminal of the comparator COMP1 is still at a low level. In this way, in the embodiment of FIG. 5, the final trigger voltage threshold is adjusted by three hysteresis resistors, and the hysteresis is implemented in the decision circuit. In addition, the hysteresis would be allowed to be shifted to a decision stage by means of the integration function of the capacitor, which eliminates the need for any intentional voltage shifting at the input stage to optimize the minimum detectable reverse voltage and current.

The first reference voltage $V_L$ and second reference voltage $V_H$ may be set as needed. For example, the second reference voltage $V_H$ may be set to be higher than the first reference voltage $V_L$ by about 200 mV to 300 mV.

The load switch of the current disclosure may determine whether to output a control signal to activate the reverse current blocking circuit 40 according to the level of the output terminal (i.e., the reverse current protection terminal $C_{RCB}$) of the comparator COMP1, so as to prevent the current from flowing from the voltage output terminal $V_{OUT}$ to the current input terminal $V_{IN}$, as shown in FIG. 4.

In the current disclosure, the control signal for controlling the reverse current blocking circuit 40 is the signal $V_{RCB}$ at the output terminal of the comparator 200. That is, when the signal $V_{RCB}$ at the output terminal of the comparator 200 is at a high level, the signal $V_{RCB}$ would control the reverse current blocking circuit 40 to operate to block the reverse current from flowing from the power output terminal to the power input terminal. When the signal $V_{RCB}$ at the output terminal of the comparator 200 is at a low level, the signal $V_{RCB}$ would not control the reverse current blocking circuit 40 to operate to block the reverse current from flowing from the power output terminal to the power input terminal, as shown in FIG. 7. From the above, it may be seen that the load switch of the current disclosure may set the desired input offset as needed, i.e., set the final trigger threshold and hysteresis as needed, so that the power device may be better protected and the false alarm rate may be reduced.

It should be understood that the above embodiments are merely exemplary embodiments adopted to explain the principles of the current disclosure, and the current disclosure is not limited thereto. It would be apparent to one of ordinary skill in the art that various changes and modifications may be made therein without departing from the spirit and scope of the current disclosure, and such changes and modifications also fall within the scope of the current disclosure.

What is claimed is:

1. A load switch comprising: a power input terminal, a power output terminal, a voltage-current conversion circuit, a capacitor and a comparator,
   wherein the power input terminal is configured to receive an input voltage;
   wherein the power output terminal is configured to provide an output voltage;
   wherein the voltage-current conversion circuit comprises a first input terminal, a second input terminal and a current difference output terminal, wherein the first input terminal and the second input terminal are connected to the power output terminal and the power input terminal, respectively, and configured to receive the output voltage and the input voltage, respectively; and wherein a current difference corresponding to a voltage difference between the output voltage and the input voltage is output at the current difference output terminal;
   a first terminal of the capacitor is connected to the current difference output terminal, to integrate the current difference to obtain an average voltage difference corresponding to the voltage difference between the output voltage and the input voltage during an integration period for the capacitor, and a second terminal of the capacitor is connected to a ground line; and
   wherein the first terminal of the capacitor is further connected to a first input terminal of the comparator, a second input terminal of the comparator is applied with at least one reference voltage, and an output terminal of the comparator is a reverse current protection terminal to determine whether to send a signal to prevent current from flowing from the power output terminal to the power input terminal according to a value at the output terminal of the comparator.

2. The load switch of claim 1, further comprising a reference voltage module,
wherein the reference voltage module comprises a plurality of hysteresis resistors connected in series between the ground line and a reference voltage terminal and configured to provide the at least one reference voltage.

3. The load switch of claim 2, further comprising a plurality of hysteresis transistors,
wherein the plurality of hysteresis transistors have first electrodes that are all connected to the second terminal of the comparator;
wherein the plurality of hysteresis transistors have second electrodes that are connected between every two adjacent hysteresis resistors in the plurality of hysteresis resistors, respectively; and
wherein the plurality of hysteresis transistors have gate electrodes that are connected to the output terminal of the comparator, respectively.

4. The load switch of claim 3, further comprising a plurality of inverters,
wherein the plurality of inverters are connected in series, and an input terminal of a first inverter of the plurality of inverters is connected to the reverse current protection terminal, and
wherein the plurality of inverters have output terminals that are connected to the gate electrodes of the hysteresis transistors.

5. The load switch of claim 4, wherein the plurality of hysteresis resistors comprises a first hysteresis resistor, a second hysteresis resistor, and a third hysteresis resistor connected in series between the reference voltage terminal and the ground line;
wherein the plurality of hysteresis transistors comprises a first hysteresis transistor and a second hysteresis transistor;
wherein the plurality of inverters comprises a first inverter and a second inverter; and
a gate electrode of the first hysteresis transistor is connected to an output terminal of the first inverter, a gate electrode of the second hysteresis transistor is connected to an output terminal of the second inverter, a second electrode of the first hysteresis transistor is connected between the second hysteresis resistor and the third hysteresis resistor, and a second electrode of the second hysteresis transistor is connected between the third hysteresis resistor and the ground line.

6. The load switch of any of claim 1, wherein the voltage-current conversion circuit comprises a differential folded cascode amplifier.

7. The load switch of claim 6, wherein the differential folded cascode amplifier comprises a first conversion transistor, a second conversion transistor, a third conversion transistor, a fourth conversion transistor, a first conversion resistor, a first current source, a second current source, a third current source, and a fourth current source,
wherein the first input terminal is connected to a gate electrode of the first conversion transistor, the second input terminal is connected to a gate electrode of the second conversion transistor, second electrodes of the first conversion transistor and the second conversion transistor are connected to a first voltage source, a first electrode of the first conversion transistor is connected to a first terminal of the first current source, a second terminal of the first current source is connected to the ground line, a first electrode of the second conversion transistor is connected to a first terminal of the second current source, and a second terminal of the second current source is connected to the ground line;
wherein the first electrode of the first conversion transistor is further connected to a gate electrode of the third conversion transistor, a first electrode of the third conversion transistor is connected to a first terminal of the third current source, a second terminal of the third current source is connected to the ground line, and a second electrode of the third conversion transistor is connected to the current difference output terminal for transmitting an output current corresponding to the output voltage to the current difference output terminal;
wherein the first electrode of the second conversion transistor is further connected to a gate electrode of the fourth conversion transistor, a first electrode of the fourth conversion transistor is connected to a first terminal of the fourth current source, a second terminal of the fourth current source is connected to the ground line, and a second electrode of the fourth conversion transistor is connected to the current difference output terminal for transmitting an input current corresponding to the input voltage to the current difference output terminal; and
wherein the first conversion resistor is connected between the first electrode of the third conversion transistor and the first electrode of the fourth conversion transistor.

8. The load switch of claim 7, wherein the differential folded cascode amplifier further comprises a fifth conversion transistor, a sixth conversion transistor, a seventh conversion transistor, and an eighth conversion transistor,
wherein the fifth and sixth conversion transistors have gate electrodes that are connected together, first electrodes of the fifth and sixth conversion transistors are connected to the first voltage source, gate electrodes of the seventh and eighth conversion transistors are connected together, first electrodes of the seventh and eighth conversion transistors are connected to second electrodes of the fifth and sixth conversion transistors, respectively,
wherein the seventh conversion transistor and the eighth conversion transistor have second electrodes that are both connected to the current difference output terminal, and
wherein the second electrode of the third conversion transistor is connected to the first electrode of the eighth conversion transistor to be connected to the current difference output terminal through the eighth conversion transistor, and the second electrode of the fourth conversion transistor is connected to the first electrode of the seventh conversion transistor to be connected to the current difference output terminal through the seventh conversion transistor.

9. The load switch of claim 8, wherein the differential folded cascode amplifier further comprises a ninth conversion transistor, a tenth conversion transistor, an eleventh conversion transistor, a twelfth conversion transistor, and a fourth conversion resistor,
wherein the second electrode of the seventh conversion transistor is connected to gate electrodes of the ninth and tenth conversion transistors and to a first terminal of the fourth conversion resistor to be connected to the current difference output terminal through the ninth and tenth conversion transistors, the second terminal of the fourth conversion resistor is connected to a second electrode of the ninth conversion transistor and to gate electrodes of the eleventh and twelfth conversion transistors, wherein the ninth and tenth conversion transistors have first electrodes that are connected to second electrodes of the eleventh and twelfth conversion transistors, respectively, and first electrodes of the eleventh and twelfth conversion transistors are both connected to the ground line, and a second electrode of the tenth conversion transistor is connected to the current difference output terminal.

10. The load switch of claim 8, wherein the differential folded cascode amplifier further comprises a fifteenth conversion transistor, a sixteenth conversion transistor, a third resistor, and a fifth current source, wherein the fifteenth conversion transistor has a gate electrode that is connected to the gate electrode of the fifth conversion transistor, a first electrode of the fifteenth conversion transistor is connected to the first voltage source;

wherein the sixteenth conversion transistor has a gate electrode that is connected to the gate electrode of the seventh conversion transistor, and a first electrode of the sixteenth conversion transistor is connected to a second electrode of the fifteenth conversion transistor;

wherein the gate electrode of the sixteenth conversion transistor is connected to a first terminal of the fifth current source to turn on the seventh conversion transistor, the eighth conversion transistor and the sixteenth conversion transistor through the fifth current source, a second terminal of the fifth current source is connected to the ground line, and wherein the gate electrode of the fifteenth conversion transistor is connected to a second electrode of the sixteenth conversion transistor and a first terminal of the third resistor, and a second terminal of the third resistor is connected to the gate electrode of the sixteenth conversion transistor and the first terminal of the fifth current source, to turn on the fifth conversion transistor, the sixth conversion transistor and the fifteenth conversion transistor through the fifth current source.

11. The load switch of claim 9, wherein the differential folded cascode amplifier further comprises a fifteenth conversion transistor, a sixteenth conversion transistor, a third resistor, and a fifth current source, wherein the fifteenth conversion transistor has a gate electrode that is connected to the gate electrode of the fifth conversion transistor, a first electrode of the fifteenth conversion transistor is connected to the first voltage source;

wherein the sixteenth conversion transistor has a gate electrode that is connected to the gate electrode of the seventh conversion transistor, and a first electrode of the sixteenth conversion transistor is connected to a second electrode of the fifteenth conversion transistor;

wherein the gate electrode of the sixteenth conversion transistor is connected to a first terminal of the fifth current source to turn on the seventh conversion transistor, the eighth conversion transistor and the sixteenth conversion transistor through the fifth current source, a second terminal of the fifth current source is connected to the ground line, and wherein the gate electrode of the fifteenth conversion transistor is connected to a second electrode of the sixteenth conversion transistor and a first terminal of the third resistor, and a second terminal of the third resistor is connected to the gate electrode of the sixteenth conversion transistor and the first terminal of the fifth current source, to turn on the fifth conversion transistor, the sixth conversion transistor and the fifteenth conversion transistor through the fifth current source.

12. The load switch of claim 1, further comprising a reverse current blocking circuit connected to the reverse current protection terminal, and wherein the reverse current blocking circuit is activated according to a value at the reverse current protection terminal.

13. A power system comprising a power device and the load switch of claim 1, wherein the power input terminal of the load switch is connected to the power device; and wherein the power output terminal of the load switch is connected to a load to which power is to be supplied.

14. A power system comprising a power device and the load switch of claim 2, wherein the power input terminal of the load switch is connected to the power device; and wherein the power output terminal of the load switch is connected to a load to which power is to be supplied.

15. A power system comprising a power device and the load switch of claim 3, wherein the power input terminal of the load switch is connected to the power device; and wherein the power output terminal of the load switch is connected to a load to which power is to be supplied.

16. A power system comprising a power device and the load switch of claim 4, wherein the power input terminal of the load switch is connected to the power device; and wherein the power output terminal of the load switch is connected to a load to which power is to be supplied.

17. A power system comprising a power device and the load switch of claim 5, wherein the power input terminal of the load switch is connected to the power device; and wherein the power output terminal of the load switch is connected to a load to which power is to be supplied.

18. A power system comprising a power device and the load switch of claim 6, wherein the power input terminal of the load switch is connected to the power device; and wherein the power output terminal of the load switch is connected to a load to which power is to be supplied.

* * * * *